United States Patent [19]
Kimura et al.

[11] Patent Number: 5,925,429
[45] Date of Patent: Jul. 20, 1999

[54] PYROLYTIC BORON NITRIDE CONTAINER, AND MANUFACTURE THEREOF

[75] Inventors: Noboru Kimura; Takuma Kushihashi; Akira Satoh, all of Annaka, Japan

[73] Assignee: Shin-Etsu Chemical Co., Ltd., Tokyo, Japan

[21] Appl. No.: 08/901,167

[22] Filed: Jul. 28, 1997

[30] Foreign Application Priority Data

Aug. 13, 1996 [JP] Japan .................................. 8-231329

[51] Int. Cl.$^6$ ....................................................... B01L 3/04
[52] U.S. Cl. ....................... 428/34.5; 428/34.4; 428/698; 428/704; 264/81; 427/255.2
[58] Field of Search .................... 428/704, 698, 428/34.4, 34.5; 264/81; 427/255.2

[56] References Cited

U.S. PATENT DOCUMENTS

| | | | |
|---|---|---|---|
| 4,849,146 | 7/1989 | Tanji et al. ................................ | 264/81 |
| 4,913,652 | 4/1990 | Tanji et al. ............................... | 432/156 |
| 5,239,612 | 8/1993 | Morris ...................................... | 392/389 |
| 5,607,775 | 3/1997 | Kimura et al. ........................... | 428/461 |
| 5,759,646 | 6/1998 | Kano et al. .............................. | 428/34.4 |

OTHER PUBLICATIONS

"Research Report", Inorganic Material Research Laboratory, No. 27, p. 26.
"Electronic Materials," vol. 13, No. 1, pp. 32 to 37.
D.N. Bose and H.K. Henisch, (Journal of the American Ceramic Society) "Thermoluminescence in Boron Nitride Powders" vol. 53, pp. 281–282, May 1970.

*Primary Examiner*—Charles Nold
*Attorney, Agent, or Firm*—Oliff & Berridge, PLC

[57] ABSTRACT

There is disclosed a pyrolytic boron nitride container used for a Boat method in which material melt is retained In the container, and a crystal is grown while a temperature gradient is imparted to the material melt. The transmissivity of the pyrolytic boron nitride container with respect to light at a wave number ranging from 3700 cm$^{-1}$ to 6500 cm$^{-1}$ has a profile such that the transmissivity monotonously changes in the longitudinal direction of the container. The transmissivity profile is produced by imparting a pressure profile during manufacture of the container through deposition of pyrolytic boron nitride, by roughing the outer surface of the container such that the surface roughness has a profile, or by compounding pyrolytic boron nitride with a different material. It becomes possible to facilitate generation of a temperature gradient in material melt within the container and to facilitate control of a temperature profile in the container.

17 Claims, 2 Drawing Sheets

PYROLYTIC BORON NITRIDE CONTAINER, AND MANUFACTURE THEREOF

BACKGROUND OF THE INVENTION

1. Field of the Invention

The present invention relates to a pyrolytic boron nitride container. More particularly, the present invention relates to a pyrolytic boron nitride container suitable for retaining material melt used for growing a single-crystal of a III–V compound semiconductor by a Boat method, and further relates to a method of manufacturing such a pyrolytic boron nitride container.

2. Description of the Related Art

Methods of manufacturing semiconductor single-crystals of III–V compound semiconductors; e.g., GaAs single-crystals, GaP single-crystals, or InP single-crystals, are roughly divided into a Boat method and a Pulling method.

Of these methods, the Boat method is further divided into a horizontal Bridgman method (HB method), a vertical Bridgman method (VB method), a Horizontal Gradient Freeze method (HGF method), and a Vertical Gradient Freeze method (VGF method). According to these Boat methods, material melt is usually held in a container having a predetermined shape. While the material melt is being heated by a heat source provided outside the container, the heat source is moved, or a profile of heat is produced by the heat source itself, thereby producing a temperature gradient in the material melt. As a result, the material melt is solidified from the seed crystal-side so as to grow a single crystal.

In the Boat methods, a quartz boat is conventionally used as the container for retaining material melt. If quartz is used as material for the boat, Si, which is the constituent element of quartz, is mixed into a growing crystal as an impurity. Si acts as an amphoteric dopant with respect to III–V compound semiconductors. If single-crystals of a III–V compound semiconductor are grown by the Boat method through use of the quartz boat, there is usually employed a method in which a crystal is grown by doping it with Cr. However, the insulation performance of the crystal is reduced if the crystal is doped with Cr, and a resultant crystal becomes undesirable for use in IC substrates.

There arises a chemical reaction between the quartz boat and the material melt, and a so-called wetting phenomenon occurs, thereby making the crystal vulnerable to crystalline imperfections such as twinning ("Electronic Materials," Vol. 13, No. 1, pp. 32 to 37).

For these reasons, a pyrolytic boron nitride (PBN) container has recently come into use as a container for manufacturing undoped III–V compound semiconductor single-crystals having high purity. In the case where the PBN is used as a material for a boat, even when B and N which are the constituent elements of the boat are mixed in the single crystal as impurities, their levels are limited, so that they do not act as dopants. Consequently, electrical characteristics of the resultant III–V compound semiconductor single-crystals are not impaired.

The PBN has anisotropy in terms of heat conductivity in which the heat conductivity in the direction of the surface of stacked layers, namely, in the planar direction is 30 to 70 times that in thicknesswise direction. Therefore, the container acts so as to unify the temperature of material melt in both the circumferential and longitudinal directions, thereby hindering the production of a temperature gradient in the material melt according to the Boat method. This makes it difficult to control the temperature profile of the material melt within the container. As described above, the PBN has characteristics undesirable for a container used for manufacturing single-crystals by the Boat method. In practice, these characteristics of the PBN cause deterioration of the monocrystal rate of each grown crystal ingot, which indicates the rate of a monocrystal portion within each ingot.

SUMMARY OF THE INVENTION

The present invention has been conceived in view of the foregoing drawbacks. An object of the present invention is to provide a pyrolytic boron nitride (hereinafter referred to as PBN) container which enables facilitated generation of a temperature gradient in material melt within the container and facilitated control of a temperature profile in the container by imparting a profile to the infrared-radiation transmissivity (hereinafter referred to as the "IR transmissivity") of the PBN container used for a Boat method, thereby improving the monocrystal rate of high-purity III–V compound semiconductor single-crystals.

Another object of the present invention is to provide a method of manufacturing such a PBN container.

To these ends, according to a first aspect of the present invention, there is provided a PBN container used for a Boat method in which material melt is retained in a container, and a crystal is grown while a temperature gradient is imparted to the material melt, wherein the transmissivity of the PBN container with respect to light at a wave number ranging from 3700 $cm^{-1}$ to 6500 $cm^{-1}$ has a profile such that the transmissivity monotonously changes in the longitudinal direction of the container.

As a result of imparting such a profile to the IR transmissivity of the PBN used for the Boat method, it becomes easy to produce a temperature gradient in material melt within the container, and the temperature profile in the container can be easily controlled.

Preferably, the profile of the transmissivity is set so as to become larger stepwise or gradually from the seed crystal area of the container to the area opposite to the seed crystal area. Alternatively, the profile of the transmissivity is preferably set so as to become smaller stepwise or gradually from the seed crystal area to the area of the container opposite to the seed crystal area.

As described above, as a result of imparting a profile to the IR transmissivity of the PBN container in its longitudinal direction thereby to produce a temperature gradient for the Boat method, in either case where the PBN container is subjected to resistance heating or where the PBN container is subjected to RF heating, the container can have a low temperature at its seed crystal area but a high temperature at its crystal growing area. As a result, a crystal can be grown in an ideal temperature environment.

Preferably, a profile is imparted to the absorptivity of the PBN (used for the Boat method) with respect to light at a wave number ranging from 3700 $cm^{-1}$ to 6500 $cm^{-1}$ such that the absorptivity changes in the longitudinal direction. In this case, it becomes easy to produce a temperature gradient in material melt within the PBN container and to control the temperature profile in the PBN container. As a result, it becomes easier to manufacture high-quality crystals.

According to a second aspect of the present invention, there is provided a method of manufacturing a container whose IR transmissivity has a profile such that the transmissivity varies in its longitudinal direction. In this method, PBN is deposited on a graphite mandrel by chemical vapor deposition (hereinafter referred to as CVD) in order to form a PBN container, and the PBN container is then separated from the mandrel, wherein the density of the PBN produced by CVD is controlled by placing the mandrel according to the pressure profile in a CVD furnace.

Preferably, the roughness of the outer surface of the PBN container has a profile in which the roughness gradually or stepwise changes from the seed crystal area of the container to the area of the container opposite to the seed crystal area.

In this way, the PBN container having the above-described IR transmissivity can be also manufactured by imparting a profile to the roughness of the outer surface of the PBN container so as to cause variations in the degree of scattering of radiated light.

Even in this case, if the roughness of the outer surface of the PBN container is set so as to become smaller stepwise or gradually from the seed crystal area of the PBN container to the area of the container opposite to the seed crystal area, crystals can be grown in an ideal temperature environment in which the container has a low temperature at its the seed crystal area but a high temperature at its crystal growing area.

Preferably, the profile of monotonously changing transmissivity is produced by compounding PBN with a material that is different from the PBN in terms of transmissivity with respect to light at a wave number ranging from 3700 cm$^{-1}$ to 6500 cm$^{-1}$.

In this way, the PBN container having the above-described IR transmissivity profile can be manufactured by compounding PBN with a material that has a transmissivity different from that of PBN.

In this case, the material having a different transmissivity is preferably arranged so as not to be exposed on the internal surface of the container. Preferably, the material to be compounded is selected from the group consisting of pyrolytic graphite, silicon carbide, silicon nitride, aluminum nitride, and pyrolytic boron nitride doped with B, N, Si, C or Al, whose transmissivities differ from that of PBN.

If crystals are manufactured by the Boat method through use of the PBN which has a transmissivity profile with respect to light ranging from 3700 cm$^{-1}$ to 6500 cm$^{-1}$, they can be manufactured with an ideal temperature profile, and the control of temperature becomes easy. As a result, crystals can be manufactured efficiently.

In this case, particularly in a case where GaAs, GaP, or InP crystals are manufactured, the pyrolytic boron nitride does not produce impurities to such a level that they act as dopants for these compound semiconductors. Accordingly, it is possible to manufacture high-quality crystals efficiently.

DESCRIPTION OF THE INVENTION AND PREFERRED EMBODIMENTS

Figure 1A:
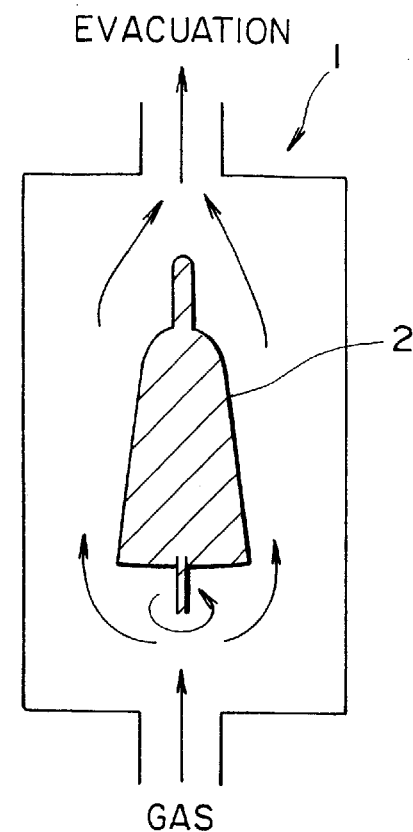
FIG. 1A is a schematic cross-sectional view illustrating the manufacture of a PBN container for a Boat method by CVD, in which a graphite mandrel is positioned such that a crystal growing area of the container is directed to the supply of source gas.

The present invention and its embodiments will be described in detail hereinbelow, but the present invention is not limited to the embodiments.

The inventors of the present invention have performed studies on the difficulty of producing a temperature gradient in material melt and on the difficulty of controlling the temperature profile of material melt in the Boat method, both stemming from anisotropy of the PBN container. As a result, the inventors have found that these difficulties can be solved effectively by imparting a profile to the IR transmissivity of the PBN container such that the transmissivity monotonously changes in the longitudinal direction of the PBN container. The present invention was accomplished based on this finding. Specifically, a profile is imparted to the IR transmissivity of the PBN container in the direction in which a temperature gradient is to be produced, so that during growth of compound semiconductor crystals, a temperature gradient is produced in material melt within the container such that the temperature at the seed crystal area becomes low whereas the temperature at the crystal growing area becomes high. This enables in an ideal temperature environment.

First, the inventors performed studies on the wavelength of radiation to be passed through a container used for the Boat method. According to the Boat method, the temperature used in a process of manufacturing III–V compound semiconductor single-crystals ranges from about 800 to 1,600° C., and the maximum energy-transfer wavelength λ max at this time is represented by Expression (1):

$$\lambda max = 2,898 \ (\mu m \cdot K)/T, \quad (1)$$

where T is the temperatures in degrees Kelvin.

When λ max is calculated with regard to the above-described temperature range, a value ranging from 3700 cm$^{-1}$ to 6500 cm$^{-1}$ is obtained as wave number corresponding to λ max. Particularly in a case where III–V compound semiconductor single-crystals to be manufactured are GaAs single-crystals, the wave number corresponding to λ max is 5,200±500 cm$^{-1}$, or 4700 cm$^{-1}$ to 5700 cm$^{-1}$, because GaAs has a melting point of about 1,237° C. Consequently, if a profile is imparted to the transmissivity with respect to light ranging from 3,700 cm$^{-1}$ to 6,500 cm$^{-1}$, it becomes possible to control the temperature profile in the material melt within the container.

For example, if a resistance-heating type heating unit, such as a carbon heater, arranged around a container is employed as a heat source, heat is supplied to material melt from the outside of the container in the form of radiant heat. Once radiant heat has been absorbed by pyrolytic boron nitride that constitutes the container, the heat is uniformly distributed. When the transmissivity of the pyrolytic boron nitride container with respect to light at a wave number ranging from 3,700 cm$^{-1}$ to 6,500 cm$^{-1}$ is imparted with a profile such that the transmissivity gradually or stepwise increases from the seed crystal area of the container to its crystal growing area, the crystal growing area of the container can be efficiently and selectively heated, thereby enabling production of a temperature profile within the material melt such that the material melt has a low temperature at its seed crystal area but a high temperature at its crystal growing area.

Further, for example, if an induction heating unit such as an RF coil arranged around a container is employed as a heat source, heat is supplied to the material melt in the form of Joule heat generated by induction currents in the material melt. In this case, heat generated in the container is dissipated to the outside of the container.

Contrast to the foregoing case, if the transmissivity of the PBN container with respect to the light at a wave number ranging from 3,700 $cm^{-1}$ to 6,500 $cm^{-1}$ is imparted with a profile in which the transmissivity becomes smaller stepwise or gradually from the seed crystal area to the growing crystal area of the container, the dissipation of heat from the seed crystal area of the container can be further promoted. Therefore, it becomes possible to produce a temperature profile with the material melt such that the material melt has a low temperature at its seed crystal area but has a high temperature at its growing crystal area.

The inventors have developed three methods for imparting a profile and changing the transmissivity of the PBN container with respect to light at a wave number ranging from 3,700 $cm^{-1}$ to 6,500 $cm^{-1}$; namely, (1) a method of changing the optical absorptivity by changing the physical properties of pyrolytic boron nitride (PBN) itself; (2) a method of changing the degree of scattering of light by changing the roughness of the outer surface of the PBN; and (3) a method of compounding a material having a different transmissivity with PBN wherein the material is changed in terms of type, species, thickness, area, etc.

These methods will be described in more detail while referring to an exemplary case where a resistance-heating type heating unit is used as a heat stove.

(1) Method of Changing the Optical Absorptivity of PBN

With regard to optical characteristics, boron nitride (BN) has a bandgap of 5.8 eV (see "Research Report," Inorganic Material Research Laboratory, No. 27, pg. 26). Boron nitride has an IR absorption at wave numbers 1,380 $cm^{-1}$ and 810 $cm^{-1}$ (see D. N. Bose, H. K. Henisch, J. Am. Cer. Soc. 53, pg. 281 (1970)). Accordingly, boron nitride should be transparent with respect to light at a wave number ranging from 3,700 $cm^{-1}$ to 6,500 $cm^{-1}$, and particularly a wave number ranging from 4,700 $cm^{-1}$ to 5,700 $cm^{-1}$. However, pyrolytic boron nitride (PBN) has crystallographic irregularities, and turbostatic crystals or the like are mixed in PBN. For these reasons, PBN becomes opaque, and in practice there is a certain degree of absorption of light even at the foregoing wave number.

Conventional PBN used in the Boat method has a high degree of orientation and a density of 2.1 to 2.2, which is close to a theoretical density of 2.25. PBN having such a high degree of orientation has an absorptivity of about 1.9 or more with respect to light at a wave number ranging from 3,700 $cm^{-1}$ to 6,500 $cm^{-1}$. Accordingly, in order to reduce the absorptivity of the crystal growing area of the container and to thereby permit more effective transmission of radiation through that area, in comparison to a conventional PBN container, the absorptivity of at least the crystal growing area of the container is desirably set to 1.7 or less.

Further, in order to produce a difference in absorptivity between the seed crystal area and the crystal growing area of the container, thereby permitting transmission of radiant heat through the crystal growing area of the container and absorption of radiant heat in the seed crystal area of the container and enabling effective transfer of heat to the crystal growing area of the container, the difference in absorptivity between the seed crystal area and the crystal growing area of the container is set to 0.5 or more, preferably 1.0 or more.

An explanation is given of a method of manufacturing a PBN container of the present invention which has a low optical absorptivity at its crystal growing area but has a high absorptivity at its seed crystal area.

Generally, a PBN container (or boat) is manufactured by a process in which PBN is deposited on a graphite mandrel by CVD in order to form a PBN container, and the PBN container is separated from the mandrel.

For example, a PBN container can be manufactured through use of boron halide and ammonium as source gases. PBN is deposited on the graphite mandrel having a desired shape through CVD at a high temperature ranging from 1,600–2,000° C. under a pressure of 10 Torr or less, so that a PBN container having a required thickness is formed on the mandrel. Subsequently, the PBN container is cooled to room temperature, and the graphite mandrel is removed. Subsequently, the PBN container is machined into a final shape.

As a result of experimental studies performed by the inventors, it has been found that the transmissivity and absorptivity of PBN with respect to light at a wave number ranging from 3,700 $cm^{-1}$ to 6,500 $cm^{-1}$ depend on the conditions for the CVD of PBN, particularly on pressures.

More specifically, it has been found that if the CVD of PBN is carried out under a comparatively high pressure, the density of deposited PBN tends to be comparatively low. As a result, the transmissivity of PBN becomes comparatively high, whereas the absorptivity of the same becomes comparatively low. In contrast, if the CVD of PBN is carried out under a comparatively low pressure, there is a tendency opposite to the previously-described tendency.

Although the details of the phenomena are theoretically unknown, if the CVD of PBN is carried out under a comparatively high pressure, the density of PBN tends to be comparatively low. Therefore, it is considered that the thus-deposited PBN is partially vitrified, as a result of which the transparency of the PBN with respect to light at a wave number ranging from 3,700 $cm^{-1}$ to 6,500 $cm^{-1}$ increases.

Utilization of the above-described phenomena makes it possible to decrease the absorptivity of the PBN container at the crystal growing area and to produce a difference in absorptivity between the crystal growing area and the seed crystal area of the PBN container.

As previously described, since the PBN container is manufactured by CVD under a reduced pressure, the manufacture of the PBN container is carried out by supplying source gases to a CVD furnace while the CVD is evacuated by a pump. Accordingly, there arises a pressure profile in the CVD furnace wherein the pressure becomes high on the source gas supply side and becomes low on the evacuation side. If PBN is chemically deposited on the graphite mandrel which is positioned in such a way that the crystal growing area of the PBN container is placed in a high-pressure area, or in the vicinity of a port for receiving source gases, and the seed crystal area of the PBN container is placed in a low-pressure area, or in the vicinity of an evacuation port, a resultantly-produced PBN container has low absorptivity at its crystal growing area but high absorptivity at its seed crystal area.

Particularly, when it is desired to increase the difference in absorptivity and transmissivity between the crystal growing area and the seed crystal area of the PBN container, the difference can be increased by increasing the pressure difference between a location where the crystal growing area of the container is positioned and a location where the seed crystal area of the same is positioned. Therefore, in this case, it is necessary to make the gradient of a pressure profile steep by increasing the pressure loss in the CVD furnace. The gradient of the pressure profile can be easily made steep by a commonly-practiced method such as a method in which a pressure loss is forcibly produced by control of the amount of supplied source gases, by adjusting the evacuating capacity of the pump, by changing the shape of the CVD furnace, or by providing a baffle plate in the CVD furnace.

(2) Method of Changing the Degree of Scattering of Light by changing the Roughness of the External Surface of PBN A profile can be also imparted to the transmissivity and absorptivity of the PBN container with respect to light at a wave number ranging from 3,700 $cm^{-1}$ to 6,500 $cm^{-1}$ by controlling the state of the surface of PBN, or the surface roughness of PBN.

For example, Table 1 shows the results of studies on the relationship between the surface roughness of PBN and the transmissivity and absorptivity at a wave number ranging from 3,700 $cm^{-1}$ to 6,500 $cm^{-1}$.

TABLE 1

| Surface finishing | Absorptivity | Thickness (mm) | Apparent transmissivity (%) | Apparent absorptivity (/mm) |
|---|---|---|---|---|
| As-depo | 1.03 | 0.363 | 38.889 | 1.130 |
| #320 | | 0.373 | 9.447 | 2.747 |
| #1200 | | 0.364 | 25.817 | 1.616 |
| As-depo | 2.10 | 0.189 | 39.882 | 2.112 |
| #320 | | 0.162 | 10.915 | 5.938 |
| #1200 | | 0.154 | 29.739 | 3.420 |

The results show differences in apparent optical transmissivity and absorptivity among (1) PBN having an absorptivity of 1.03 was left as is after having been deposited by CVD (As-depo); (2) PBN having an absorptivity of 1.03 was sanded with coarse #320 $Al_2O_3$ paper; (3) PBN having an absorptivity of 1.03 was sanded with fine #1200 $Al_2O_3$ paper; (4) PBN having an absorptivity of 2.10 was left as is after having been deposited by means of CVD; (5) PBN having an absorptivity of 2.10 was sanded with coarse #320 $Al_2O_3$ paper; (6) and PBN having an absorptivity of 2.10 was sanded with fine #1200 $Al_2O_3$ paper.

As is evident from Table 1, in the case of As-depo, there is a small difference between the inherent absorptivity and the apparent absorptivity, and therefore it is considered that there is a relatively low degree of scattering of light from the surface of the PBN. In contrast, in the case of PBN sanded with #320 paper, the surface of PBN is coarse, which in turn results in a high degree of scattering of light. Therefore, the apparent absorptivity of PBN becomes considerably high, whilst the transmissivity of the same becomes low. In the case of PBN sanded with #1200 paper, the surface of PBN becomes finer than that of the PBN sanded with the #320 paper. Therefore, the degree of scattering of light is decreased, and the apparent absorptivity of PBN is also reduced, thereby resulting in an increase in transmissivity of PBN.

As described above, the transmissivity of PBN can be changed by controlling its surface roughness. Therefore, for example, the outer surface in the seed crystal area of the PBN container is sanded with #320 paper, and a crystal growing area of the PBN container is left as is after having been deposited. The portion of the outer surface between the seed crystal area and the crystal growing area is sanded with #1200 paper. In this case, the PBN container has a coarse outer surface in its seed crystal area but a fine outer surface in its crystal growing area, so that the transmissivity of the PBN container becomes gradually or stepwise large from the seed crystal area to the crystal growing area of the PBN container.

(3) Method of Compounding PBN with a Material of Different Transmissivity

This method enables a transmissivity profile to be reliably and accurately imparted to a PBN container even if PBN itself is homogeneous and does not have any transmissivity profile. In this method, it is only required to compound PBN with a material of different transmissivity.

In this case, a material to be compounded is required to be different in transmissivity from pyrolytic boron nitride, to have heat resistance, and to have superior adhesiveness with respect to PBN. Therefore, the material is selected from the group consisting of pyrolytic graphite, silicon carbide, silicon nitride, aluminum nitride, and pyrolytic boron nitride doped with B, N, Si, C, or Al.

The material may be compounded with PBN by coating the surface of the PBN container with the material having a different transmissivity. However, if the inner surface of the PBN container is coated with the material, there is a risk of contaminating a crystal to be grown. For this reason, the compound material is preferably prevented from being exposed on the inner surface of the PBN container. Consequently, the material is coated on the outer surface of the PBN container, or is embedded in the PBN container by coating the PBN container with the above-described material and by depositing PBN on the material, thereby completely eliminating the risk of contaminating a crystal being grown with the material.

The material of different transmissivity can be coated on the surface of the PBN container by a common method such as so-called coating or dipping. In terms of adhesiveness, compactness, uniformity, and ease of control of film thickness, the material is preferably deposited on the PBN container by CVD.

The transmissivity profile of the PBN container with respect to light at a wave number ranging from 3,700 $cm^{-1}$ to 6,500 $cm^{-1}$ can be desirably controlled by adjusting the type or thickness of material to be compounded, a coated area, or the concentration of dopant.

For example, when the thickness of the material in the seed crystal area of the PBN container is made large, the concentration of dopant at the seed crystal area is made high, or the coated area of the seed crystal area is made wide, whereas the thickness of the material in the crystal growing area is made small, the coated area of the crystal growing area is made narrow, or the above-mentioned material is not compounded with PBN in the crystal growing area, the optical transmissivity can be changed gradually or stepwise from the seed crystal area to the crystal growing area of the container.

Embodiments of the present invention will now be described by way of examples. However, the present invention is not limited thereto.

EXAMPLES

Example 1 and Comparative example 1

Figure 1B:
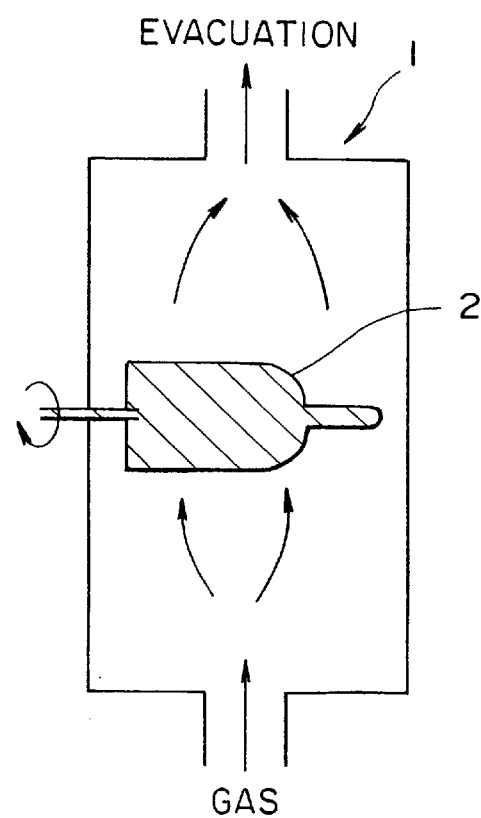
FIG. 1B is a schematic cross-sectional view similar to FIG. 1A, wherein the graphite mandrel is positioned such that the side of the container is directed to the supply of source.

In Example 1, in order to increase the density of PBN in a seed crystal area of a container used in the Boat method, a graphite mandrel was disposed in a cylindrical graphite CVD furnace in such a way that the seed crystal area of the container is positioned in a low-pressure region, and a crystal growing area of the container is positioned in the vicinity of a source gas supply port (FIG. 1A). In Comparative Example 1, in order to obtain a container having a uniform density distribution throughout the container, the mandrel was disposed in such a way that the side of the container was positioned in the vicinity of the source gas supply port (FIG. 1B). PBN was deposited on the mandrel while rotating the thus-disposed mandrel.

Boron trichloride and ammonium were supplied to the furnace at 2 l/min. and 5 l/min., respectively, and reacted at a temperature of 1,850° C. under a mean pressure of 2 Torr at the center of the furnace, whereby a PBN container having a thickness of 0.8 to 1.3 mm, a diameter of 3 inches (a diameter of ¼ inches in the seed crystal area), and a length of 200 mm was manufactured. At this time, the pressure in the area around the source gas supply port within the CVD furnace was about 4 Torr, and the pressure in the area around an evacuation portion was about 2 Torr. After the reaction, the PBN container was separated from the mandrel. The PBN container was then machined, so that a PBN container having a diameter of 3 inches was manufactured.

The amounts A of 3,700 cm$^{-1}$–6,500 cm$^{-1}$ light absorbed by the crystal growing area, the center and the seed crystal area of the PBN container were measured through use of an IR spectrometer. For the crystal growing area, the center, and the seed crystal area, absorptivity B with respect to light at a wave number of 4,800 cm$^{-1}$ was obtained from Equations (2), (3), and (4) provided below. Table 2 shows the results of the calculation.

$$\text{Amount of absorbed light } A = Log_{10}(I_0/I), \quad (2)$$

where $I_0$ is the intensity of incident light, and I is the intensity of transmitted light;

$$\text{Absorptivity } B = A/t, \quad (3)$$

where t is a thickness of PBN; and $$\text{Transmissivity } (T) = I/I_0. \quad (4)$$

TABLE 2

| PBN container | Absorptivity | | |
| --- | --- | --- | --- |
| | Crystal growing area | Center of container | Seed crystal area |
| Example 1 | 0.8 | 1.3 | 2.0 |
| Comparative example 1 | 2.1 | 2.0 | 1.9 |

As is evident from the results shown in Table 2, the absorptivity of the crystal growing area of the container of Example 1 is low, whereas the absorptivity of the seed crystal area of the container is high. If this container is used for the Boat method, it is expected that an ideal temperature profile will be produced in material melt in the container by virtue of the transmission of radiant heat through the crystal growing area, as well as of the transfer of heat from the seed crystal area to the crystal growing area. In contrast, the overall container of Comparative example 1 has high absorptivity, and hence uniform heating is accomplished by PBN. This makes it difficult to control the temperature profile of the material melt, and hence making inappropriate for the manufacture of single-crystals.

Example 2

Next, a PBN container which as a whole has uniform absorptivity and transmissivity was formed in the same manner as was Comparative Example 1. In this case, a mean pressure in the furnace was set to 4 Torr so as to reduce the absorptivity of the overall container. The absorptivity and transmissivity of each portion of the thus-formed PBN container with respect to light at a wave number of 4,800 cm$^{-1}$ were previously measured.

Figure 2:
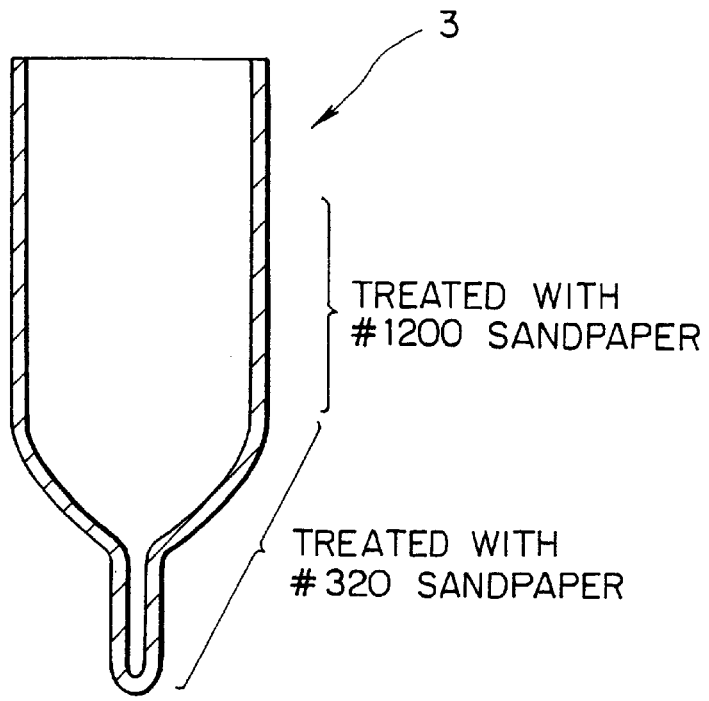
FIG. 2 is a schematic cross-sectional view of a PBN container, wherein the seed crystal area of the container is sanded with #320 alumina sandpaper, and the center of the container measuring about 10 cm is sanded with #1200 alumina sandpaper while the crystal growing area of the container is left as is after having been deposited.

As illustrated in FIG. 2, the seed crystal area of the PBN container was sanded with #320 alumina sandpaper, and the center of the PBN container which measures about 10 cm was sanded with #1200 alumina sandpaper. The crystal growing area of the PBN container was left as is after having been deposited. The transmissivity of each of portion of the thus-sanded PBN container with respect to light of 4,800 cm$^{-1}$ was measured again. Table 3 shows the results of the measurement.

TABLE 3

| | Crystal growing area | Center of container | Seed crystal area |
| --- | --- | --- | --- |
| Absorptivity | 0.8 | 1.0 | 0.9 |
| Transmissivity (%) | 10.9 | 6.3 | 8.3 |
| Post-process (%) transmissivity (%) | 10.8 | 3.8 | 1.82 |

As is evident from the results shown in Table 3, light scatters from the roughly-sanded surface of the seed crystal area of the PBN container of Example 2, and hence the transmissivity of the seed crystal area of the PBN has become low. In contrast, since the crystal growing area of the PBN is left as is after having been deposited, it has a high optical transmissivity. If this PBN container is used for the Boat method, the crystal growing area of the PBN container is apt to permit transmission of radiant heat, but the seed crystal area of the same is less likely to permit transmission of radiant heat. As a result, it is expected that an ideal temperature gradient will be produced in material melt in the PBN container. The temperature profile of the material melt becomes easy to control and suitable for the manufacture of single crystals.

Example 3

Next, a PBN container which as a whole has uniform absorptivity and transmissivity was formed in the same manner as was Comparative Example 1. In this case, a mean pressure in the furnace was set to 4 Torr so as to reduce the absorptivity of the overall container. The absorptivity and transmissivity of each portion of the thus-formed PBN container with respect to light at a wave number of 4,800 cm$^{-1}$ were previously measured.

Figure 3:
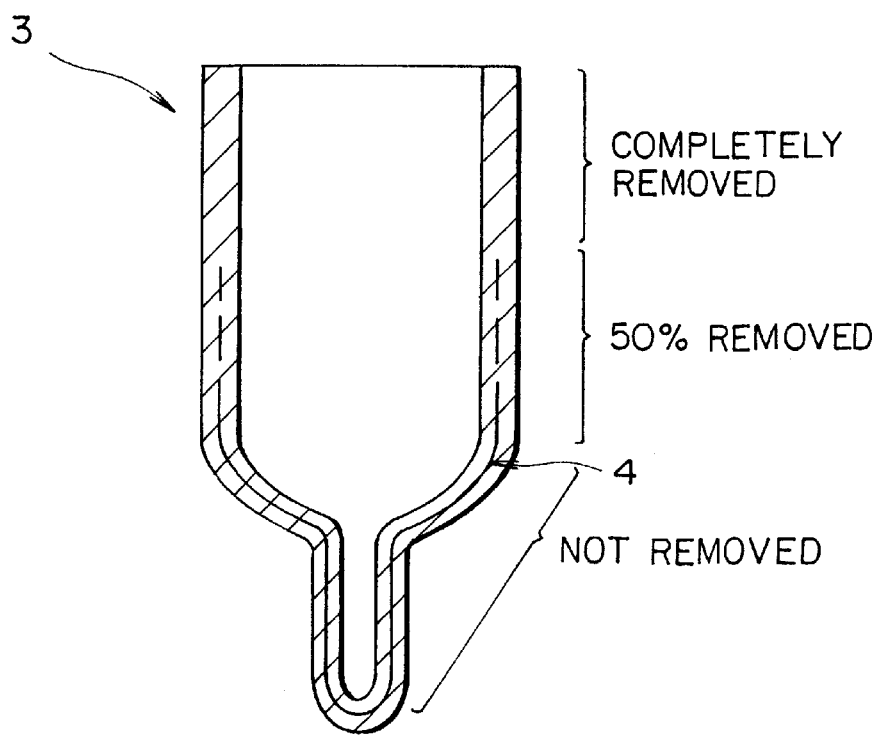
FIG. 3 is a schematic cross-sectional view of a PBN container formed by a compound of carbon and pyrolytic boron nitride.

The thus-formed PBN container was set in the CVD furnace again, and methane gas was supplied to the furnace at 5SLM under a reduced pressure of 1 Torr at a temperature of 1,600° C., so that a carbon layer (pyrolytic graphite: PG) was formed over the surface of the PBN container. The thus-coated PBN container was taken out of the furnace after having been cooled. As illustrated in FIG. 3, the entire carbon layer was removed by mechanical abrasion from the crystal growing area measuring about 10 cm. About 50% of the carbon layer was removed from the center measuring about 10 cm, and the carbon layer on the seed crystal area was left as is. The surface-treated PBN was set in the CVD furnace again, and a PBN layer was deposited to a thickness of about 100 $\mu$m on the outermost surface of the PBN container. As a result, the carbon layer was embedded in the PBN coating.

The transmissivity of the crystal growing and seed crystal areas of the thus-compounded PBN container with respect to light of 4,800 cm$^{-1}$ was measured again. Table 4 shows the results of the measurement.

TABLE 4

|  | Crystal growing area | Center of container | Seed crystal area |
|---|---|---|---|
| Absorptivity | 0.9 | 1.0 | 0.9 |
| Transmissivity (%) | 8.3 | 6.3 | 8.3 |
| Post-composition transmissivity (%) | 6.8 | 5.0–0.03 | 0.03 |

As is evident from the results shown in Table 4, carbon absorbs light in the seed crystal area of the PBN container of Example 3 in which PBN is compounded with carbon. As a result, the transmissivity of the seed crystal area of the PBN container becomes very low. In contrast, the crystal growing area of the PBN container is not compounded with carbon, and PBN is left as is after having been deposited. Therefore, the crystal growing area has high optical transmissivity. If the PBN container is used for the Boat method, the crystal growing area of the PBN container is apt to permit transmission of radiant heat, but the seed crystal area of the same is less likely to permit transmission of radiant heat. As a result, it is expected that an ideal temperature gradient will be produced in material melt in the PBN container. The temperature profile of the material melt becomes easy to control and suitable for the manufacture of single crystals.

Subsequently, a GaAs single crystal having a diameter of 3 inches was grown by the Boat method through use of each of the PBN containers manufactured in the previous Examples 1 through 3 and Comparative example 1. A seed crystal was placed in the ¼ inch-portion of the container, and the container was filled with 4,500 g of GaAs polycrystalline material. Further, 200 g of B$_2$O$_3$ liquid sealant was put in the container. These materials were heated and melted by a carbon heater disposed outside the container. The melt was gradually cooled at a rate of 20° C./min, whereby a GaAs single-crystal ingot was grown. Table 5 shows the results of this experiment.

TABLE 5

| Used PBN crucible | Number of grown ingots | Number of ingots containing only monocrystal | Number of ingots containing polycrystal |
|---|---|---|---|
| Example 1 | 11 | 10 | 1 |
| Example 2 | 8 | 6 | 2 |
| Example 3 | 7 | 6 | 1 |
| Comparative example 1 | 6 | 1 | 5 |

As is evident from Table 5, in a case where the PBN containers of the Examples, particularly the PBN container of Example 1, were used, ingots composed of only single-crystals were obtained at a probability of 90% or higher. Since the material melt has an ideal temperature profile, single-crystal ingots can be grown with extreme stability.

In contrast, in a case where the PBN container of Comparative example 1 was used, the temperature of the material melt was difficult to control, and producing a temperature gradient in the material melt was also difficult. The crystal was grown with extreme instability, and the monocrystal rate was low.

The present invention is not limited to the above-described embodiment. The above-described embodiment is a mere example, and those having the substantially same structure as that described in the appended claims and providing the similar action and effects are included in the scope of the present invention.

For example, although the description has been made chiefly with reference to a case where a resistance-heating heater is used as a heat source, the present invention is not limited to this case. As a matter of course, the present invention can be also applied to such a case where material melt in a container itself is heated from inside by high frequency heating and therefore the transmissivity profile of the container is reversed. Even in this case, the invention can provide the same effect.

The three methods were mentioned as methods of imparting a profile to the transmissivity of the container in the previous description, and they were individually explained. However, these methods may be carried out at one time. In this case, a finer transmissivity profile can be produced.

What is claimed is:

1. A pyrolytic boron nitride container used for a Boat method in which material melt is retained in the container, and a crystal is grown while a temperature gradient is imparted to the material melt, wherein the transmissivity of the pyrolytic boron nitride container with respect to light at a wave number ranging from 3700 cm$^{-1}$ to 6500 cm$^{-1}$ has a profile such that the transmissivity monotonously changes in the longitudinal direction of the container.

2. A pyrolytic boron nitride container according to claim 1, wherein the profile of the transmissivity is set so as to become larger stepwise or gradually from a seed crystal area of the container to the area opposite to the seed crystal area.

3. A pyrolytic boron nitride container according to claim 1, wherein the profile of the transmissivity is set so as to become smaller stepwise or gradually from a seed crystal area of the container to the area opposite to the seed crystal area.

4. A pyrolytic boron nitride container according to claim 1, wherein the absorptivity with respect to light at a wave number ranging from 3700 cm$^{-1}$ to 6500 cm$^{-1}$ has a profile such that the absorptivity changes in the longitudinal direction of the container.

5. A pyrolytic boron nitride container according to claim 2, wherein the absorptivity with respect to light at a wave number ranging from 3700 cm$^{-1}$ to 6500 cm$^{-1}$ has a profile such that the absorptivity changes in the longitudinal direction of the container.

6. A pyrolytic boron nitride container according to claim 3, wherein the absorptivity with respect to light at a wave number ranging from 3700 cm$^{-1}$ to 6500 cm$^{-1}$ has a profile such that the absorptivity changes in the longitudinal direction of the container.

7. A pyrolytic boron nitride container according to claim 1, wherein the roughness of the outer surface of the pyrolytic boron nitride container varies stepwise or gradually from a seed crystal area of the container to the area opposite to the seed crystal area.

8. A pyrolytic boron nitride container according to claim 7, wherein the roughness of the outer surface of the pyrolytic boron nitride container become smaller stepwise or gradually from a seed crystal area of the container to the area opposite to the seed crystal area.

9. A pyrolytic boron nitride container according to claim 1, wherein the profile of monotonously changing transmissivity is produced by compounding pyrolytic boron nitride with a material that is different from the pyrolytic boron nitride in terms of transmissivity with respect to light at a wave number ranging from 3700 cm$^{-1}$ to 6500 cm$^{-1}$.

10. A pyrolytic boron nitride container according to claim 2, wherein the profile of monotonously changing transmissivity is produced by compounding pyrolytic boron nitride with a material that is different from the pyrolytic boron nitride in terms of transmissivity with respect to light at a wave number ranging from 3700 $cm^{-1}$ to 6500 $cm^{-1}$.

11. A pyrolytic boron nitride container according to claim 3, wherein the profile of monotonously changing transmissivity is produced by compounding pyrolytic boron nitride with a material that is different from the pyrolytic boron nitride in terms of transmissivity with respect to light at a wave number ranging from 3700 $cm^{-1}$ to 6500 $cm^{-1}$.

12. A pyrolytic boron nitride container according to claim 9, wherein the material having a transmissivity different from that of the pyrolytic boron nitride is arranged so as not to be exposed on the internal surface of the container.

13. A pyrolytic boron nitride container according to claim 9, wherein the material having a transmissivity different from that of the pyrolytic boron nitride is selected from the group consisting of pyrolytic graphite, silicon carbide, silicon nitride, aluminum nitride, and pyrolytic boron nitride doped with B, N, Si, C or Al.

14. A pyrolytic boron nitride container according to claim 10, wherein the material having a transmissivity different from that of the pyrolytic boron nitride is selected from the group consisting of pyrolytic graphite, silicon carbide, silicon nitride, aluminum nitride, and pyrolytic boron nitride doped with B, N, Si, C or Al.

15. A pyrolytic boron nitride container according to claim 11, wherein the material having a transmissivity different from that of the pyrolytic boron nitride is selected from the group consisting of pyrolytic graphite, silicon carbide, silicon nitride, aluminum nitride, and pyrolytic boron nitride doped with B, N, Si, C or Al.

16. A pyrolytic boron nitride container according to claim 12, wherein the material having a transmissivity different from that of the pyrolytic boron nitride is selected from the group consisting of pyrolytic graphite, silicon carbide, silicon nitride, aluminum nitride, and pyrolytic boron nitride doped with B, N, Si, C or Al.

17. A method of manufacturing a pyrolytic boron nitride container, comprising the steps of:

placing a graphite mandrel in a CVD furnace according to the pressure profile within the CVD furnace;

depositing pyrolytic boron nitride on the mandrel by chemical vapor deposition in order to form a pyrolytic boron nitride container on the mandrel; and separating the pyrolytic boron nitride container from the mandrel, whereby the transmissivity of the container with respect to light at a wave number ranging from 3700 $cm^{-1}$ to 6500 $cm^{-1}$ is imparted with a profile such that the transmissivity changes in the longitudinal direction of the container.

* * * * *